(12) United States Patent
Lu et al.

(10) Patent No.: US 9,436,100 B2
(45) Date of Patent: Sep. 6, 2016

(54) EXPOSURE MACHINE

(71) Applicants: Boe Technology Group Co., Ltd., Beijing (CN); Chengdu Boe Optoelectronics Technology Co., Ltd., Chengdu, Sichuan (CN)

(72) Inventors: Zhong Lu, Beijing (CN); ByungChun Lee, Beijing (CN); Lijuan Huang, Beijing (CN); Fujiang Jin, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 167 days.

(21) Appl. No.: 14/087,806

(22) Filed: Nov. 22, 2013

(65) Prior Publication Data

US 2014/0146301 A1 May 29, 2014

(30) Foreign Application Priority Data

Nov. 26, 2012 (CN) .......................... 2012 1 0489221

(51) Int. Cl.
*G03B 27/42* (2006.01)
*G03F 7/20* (2006.01)

(52) U.S. Cl.
CPC ......... *G03F 7/70708* (2013.01); *G03F 7/2008* (2013.01)

(58) Field of Classification Search
CPC ............ G03F 1/64; G03F 1/142; G03F 1/62; G03F 1/22; G03F 1/24; G03F 1/00; G03F 1/38; G03F 1/68; G03F 7/70983; G03F 7/70716; G03F 7/707; G03F 7/70733; G03F 7/20; G03F 7/70825; G03F 7/70866
See application file for complete search history.

(56) References Cited

U.S. PATENT DOCUMENTS

| | | | |
|---|---|---|---|
| 5,923,409 A | * | 7/1999 | Hamada et al. ................. 355/72 |
| 5,929,973 A | * | 7/1999 | Kakizaki ............. G03F 7/70225 |
| | | | 355/26 |
| 2008/0213679 A1 | * | 9/2008 | Miyakawa et al. ............... 430/5 |
| 2010/0173250 A1 | * | 7/2010 | Scharnweber ................ 430/322 |

FOREIGN PATENT DOCUMENTS

| | | |
|---|---|---|
| CN | 1460972 A | 12/2003 |
| CN | 101959375 A | 1/2011 |
| CN | 102483580 A | 5/2012 |

OTHER PUBLICATIONS

English translation of the first Office Action dated Mar. 25, 2014 for the corresponding Chinese Patent Application No. 201210489221.0.

* cited by examiner

*Primary Examiner* — Mesfin T Asfaw
(74) *Attorney, Agent, or Firm* — Kinney & Lange, P.A.

(57) ABSTRACT

Disclosed is exposure machine, comprising: a loading frame, for placing an object to be exposed; a light source device, located at one side of a plane where the loading frame is positioned, wherein the light emitting direction of the light source device is perpendicular to a plane where the object to be exposed is positioned. During exposure, the loading frame will not reflect the light transmitting through the object to be exposed, and thus the stage spots are avoided. Further, when the exposure machine is operated in a vertical manner, a bidirectional exposure may be achieved only by adding a single prism into the light source device in the prior art, and thus the exposure efficiency is greatly improved.

10 Claims, 4 Drawing Sheets

EXPOSURE MACHINE

CROSS-REFERENCE TO RELATED APPLICATION

This application claims the benefit of Chinese Patent Application No. 201210489221.0 filed on Nov. 26, 2012 in the State Intellectual Property Office of China, the whole disclosure of which is incorporated herein by reference.

BACKGROUND OF THE INVENTION

1. Field of the Invention

The present invention relates to the technical field of an engineering exposure apparatus, and particularly to an exposure machine.

2. Description of the Related Art

With wide use of organic films in a photolithographic process, time for exposure has become longer and improvement for exposure effect is still required. Thus, exposure has become the bottleneck of the entire photolithographic process and puts a serious adverse affection on the engineering efficiency.

Engineering exposure machines in the prior art are operated in a manner of horizontal exposure, as shown in FIG. 1, an object to be exposed 03 is placed horizontally on a loading stage 04, the light 02 is emitted from a light source device 01 and is incident from above onto the object to perform exposure.

The loading stage of the exposure machine is of a solid structure, thus, it will contact with the whole surface of the object to be exposed, which introduces the following disadvantages. As shown in FIG. 2, after the light 02 passes through the object to be exposed 03, a small amount of light is reflected by the loading stage 04 to the object to be exposed 03 so that stage spots are formed on the object to be exposed 03. The stage spots are seriously adverse, that is, they will make product display effect abnormal. In addition to the stage spots, particles tend to be attached to the object to be exposed, and friction between the object to be exposed and the loading stage may easily introduce static electricity, etc.

SUMMARY OF THE INVENTION

The present invention has been made to overcome or alleviate at least one aspect of the above mentioned disadvantages.

According to an aspect of the present invention, there is provided an exposure machine, comprising: a loading frame, for placing an object to be exposed; a light source device, located at one side of a plane where the loading frame is positioned, wherein the light emitting direction of the light source device is perpendicular to a plane where the object to be exposed is positioned.

In another exemplary embodiment according to the present invention, the loading frame is made of light-absorbing material.

In another exemplary embodiment according to the present invention, a frame edge of the loading frame is provided with a fixing member by means of which the object to be exposed is fixed to the loading frame. Further, the fixing member is provided at a side of the loading frame which is opposed to an exposed surface of the object to be exposed. The fixing member may be a vacuum chuck or clips; alternatively, the portion of the vacuum chuck or clips which contacts with the object to be exposed is made of light-absorbing material.

In another exemplary embodiment according to the present invention, the exposure machine further comprises a supporting table which is horizontally disposed, the light source device is placed on the supporting table, and the loading frame is provided vertically on the supporting table.

Further, the supporting table is provided thereon with a track on which the loading frame is mounted in a slidable way, the loading frame being adapted to slide between an exposure position at which the loading frame faces the light source device and a non-exposure position at which the loading frame does not face the light source device.

Alternatively, the track comprises two tracks which are parallel with each other and are disposed at two sides of the light source device respectively, and the loading frame includes two loading frames which are mounted to the two tracks in a slidable way respectively.

Further alternatively, the supporting table includes a fixed table and two horizontal tables disposed respectively at two sides of the fixed table, and the light source device is disposed on the fixed table, wherein each of the tracks is divided into three sections which are disposed respectively on the fixed table and the two horizontal tables, and when the horizontal table has been rotated by a predetermined angle, the sections of the tracks on the rotated horizontal table are adjacent to and align with the sections of the tracks on the fixed table respectively.

Further alternatively, the exposure machine further comprises a translation device configured to translate the horizontal table to move it to a position where the rotation of the horizontal table does not interfere with the fixed table and to return it back to a position adjacent to the fixed table.

In another exemplary embodiment according to the present invention, the light source device comprises a light source and a prism located under the light source, wherein the light emitted vertically from the light source is reflected in the horizontal direction from two sides of the prism towards an exposure surface of the object to be exposed, and the reflected light is perpendicular to the exposure surface of the object to be exposed.

In embodiments of the present invention, the loading stage in the prior art is replaced by the loading frame, alternatively, the loading frame is provided with a fixing member to fix therein the object to be exposed, in this way, the loading frame will not reflect the light transmitting through the object to be exposed during exposing, thus the stage spots are avoided and the exposure quality is improved. In addition, when the exposure machine is operated in a vertical exposure manner, only a single prism is required to be added into the existing light source device to achieve a bidirectional exposure which improves exposure efficiency.

BRIEF DESCRIPTION OF THE DRAWINGS

The above and other features of the present invention will become more apparent by describing in detail exemplary embodiments thereof with reference to the accompanying drawings, in which:

FIG. 4a and FIG. 4b are illustrative views showing the structure of the loading frame of the exposure machine according to one exemplary embodiment of the present invention, wherein FIG. 4a shows a state in which the clips are closed, and FIG. 4b shows a state in which the clips are opened.

REFERENCE NUMERALS

Figure 1:
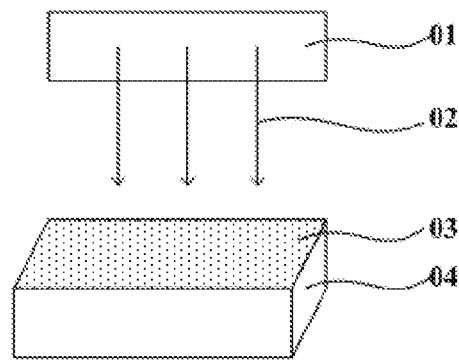
FIG. 1 is an illustrative view showing the structure of an exposure machine in the prior art.
Figure 2:
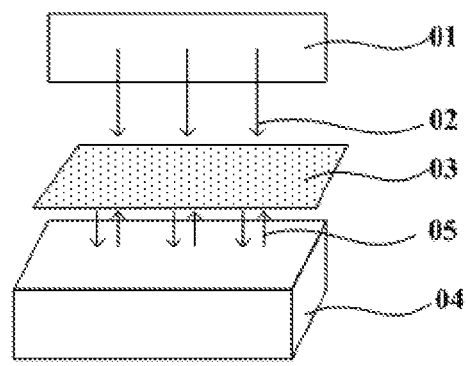
FIG. 2 is an illustrative view showing the generation of stage spots in the exposure machine in the art.

01—light source
02, 74—light
03, 2—object to be exposed
04, 1—loading stage
05—reflected light
3—clip
4—supporting table
5—horizontal table
6—fixed table
7—light source device
8—track
9—fixing member
71—prism
72—reflector
73—light source

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In order to avoid stage spots produced during exposing, an exposure machine according to an exemplary embodiment of the present invention is provided. In the exposure machine, its loading stage is a frame. Since the frame is a hollow structure, the exposure surface of the object to be exposed, after the object to be exposed is placed to the frame, is not in surface contact with the frame, in this way, the light transmitting through the object to be exposed will not be reflected by the frame, which avoids or reduces the stage spots on the object to be exposed in comparison to the prior art, and thus improves the exposure quality. The frame edge of the loading frame may be provided with a fixing member through which the object to be exposed may be fixed to the frame.

In order to further clarify the object, the solutions and the advantages of the present invention, exemplary embodiments of the present invention will be described below in detail.

Figure 3:
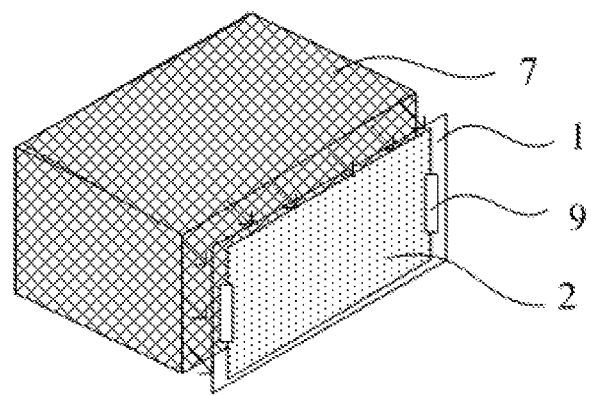
FIG. 3 is an illustrative view showing the structure of an exposure machine according to one exemplary embodiment of the present invention.

As shown in FIG. 3, the exposure machine according to one exemplary embodiment of the present invention comprises:

a loading frame 1, for placing an object to be exposed 2, wherein the frame edge of the loading frame is provided with a fixing member 9 for fixing the object to be exposed 2;

a light source device 7, located at one side of a plane where the loading frame 1 is positioned, wherein the light emitting direction of the light source device is perpendicular to a plane where the object to be exposed 2 is positioned.

In the present embodiment, the loading stage in the prior art is replaced with the loading frame 1, thus, the light, when being incident on the object to be exposed 2 in a perpendicular direction, will not be reflected by the loading frame 1 after transmitting through the object to be exposed 2. Thus, the stage spot issues are resolved. In addition, since the contact area between the loading frame 1 and the object to be exposed 2 is small, the static electricity due to friction is reduced. Furthermore, since the loading frame 1 is a frame structure, material for manufacturing the frame is saved.

Please be noted that the loading frame 1 may be placed horizontally or vertically, as long as the light transmitting through the object to be exposed 2 will not be reflected by the loading frame 1.

Alternatively, the loading frame 1 is made of light-absorbing material, for example, Aluminum alloy and silver nano-material, wherein the silver nano-material is a compound of silver and silicon oxide. The edge of the object to be exposed 2 which is contact with the loading frame 1 may have stage spots when the light transmitting through the object to be exposed 2 is reflected by the loading frame 1. When the loading frame 1 is made of light-absorbing material, the edge of the object to be exposed 2 will not have the stage spots.

The fixing member 9 may be provided at any position on the frame edge of the loading frame, and further, the fixing member 9 may have various specific structures, as long as it may fix the object to be exposed 2.

In an exemplary embodiment, the fixing member is provided at an inner side of the frame edge of the loading frame.

Figure 4A:
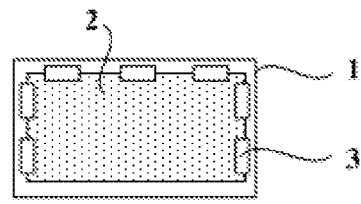
Figure 4B:
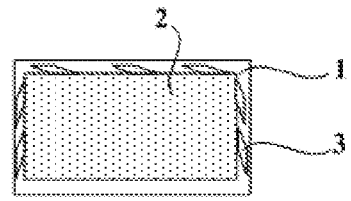

The fixing member 9 may be a vacuum chuck or clips. FIG. 4a and FIG. 4b show the manner of fixing the object to be exposed 2 by using the clips 3. In FIG. 4a, the clips 3 are in a closed state and the object to be exposed 2 is fixed to the loading frame 1, and in FIG. 4b, the clips 3 are in an opened state and thus the object to be exposed 2 may be taken out from the loading frame 1.

There are many manners for providing the fixing member to the loading frame. The fixing member may be directly and fixedly connected to the loading frame.

In an alternative embodiment of the present invention, a side of the inner portion of the loading frame which faces the light source device is provided with a barrier edge extending inwards, the object to be exposed is put into the loading frame from a side of the loading frame which is opposite to the light source device; and the clips or the vacuum chuck may be provided at one side of the loading frame which faces the light source device, and be configured to detachably press or fix the object to be exposed against the barrier edge.

The portion of the clips in contact with the object to be exposed may be made of light-absorbing material.

The object to be exposed 2 may be sucked by vacuum chucks which may be mounted to the loading frame at the locations similar to those of the clips. The vacuum chuck may be communicated with a vacuum source via a thin tube to suck the object to be exposed 2. The location where the fixing member is provided is not limited to the embodiment shown in FIG. 4a and FIG. 4b, and may be changed if necessary. The vacuum chuck is not limited to the description here, as long as it may function to fix the object to be exposed. In an exemplary embodiment, the vacuum chuck sucks the object to be exposed from one side opposite to the exposure side of the object to be exposed.

The portion of the vacuum chuck facing the object to be exposed may be made of light-absorbing material.

The vacuum chuck may suck the object to be exposed from the exposure side of the object to be exposed.

Figure 5:
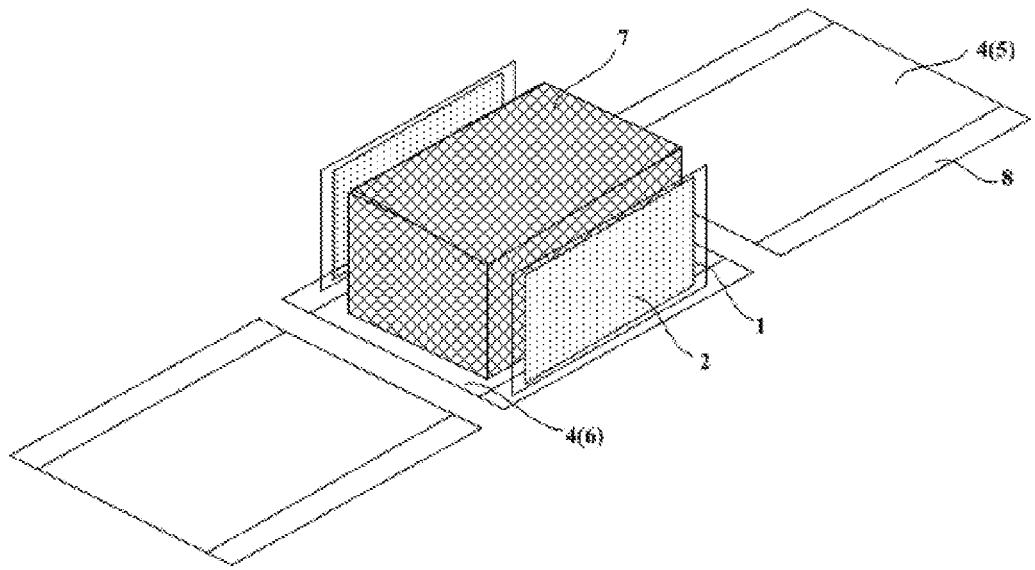
FIG. 5 is an illustrative view showing the structure of an exposure machine according to another exemplary embodiment of the present invention.

As shown in FIG. 5, an exposure machine according to another exemplary embodiment of the present invention further comprises:

a supporting table 4 which is horizontally disposed, the light source device 7 is placed on the supporting table 4, and the loading frame 1 is provided vertically on the supporting table 4.

When the loading frame 1 is disposed vertically and the object to be exposed 2 is fixed to the loading frame 1, it is difficult for particles to be attached to the object to be exposed 2.

Further referring to FIG. 5, alternatively, the supporting table 4 is provided thereon with a track 8 on which the loading frame 1 is mounted in a slidable way. The loading frame 1 is adapted to slide between an exposure position (the position shown in FIG. 5) at which the loading frame faces the light source device and a non-exposure position (the position shown in FIG. 7b) at which the loading frame does not face the light source device. With the above solution, the exposure efficiency is improved.

In an alternative exemplary embodiment, the track 8 comprises two tracks which are parallel with each other and are disposed at two sides of the light source device 7 respectively, and the loading frame 1 includes two loading frames which are mounted to the two tracks 8 in a slidable way respectively.

In the embodiment shown in FIGS. 7a-7e, the two tracks 8 each are provided with one loading frame 1. The light emitted from the light source device 7 is divided into two beams which are incident on two objects to be exposed 2 respectively in a direction perpendicular to the planes where the loading frames are located, to achieve a bidirectional exposure. The light is emitted from two sides of the light source device 7, and then incident on the objects to be exposed 2 at the two sides of light source device 7 in the perpendicular direction. Since the loading frame 1 is a frame structure, the light transmitting through the object to be exposed will not be reflected by the central portion of the loading frame 1, the stage spots are avoid or reduced, and thus the exposure quality is improved. In addition, two objects to be exposed 2 may be exposed at the same time, which greatly improves the exposure efficiency.

As shown in FIG. 5, the supporting table 4 includes a fixed table 6 and two horizontal tables 5 disposed respectively at two sides of the fixed table 5, and the light source device 7 is disposed on the fixed table 6. Each of the tracks 8 is divided into three sections which are disposed respectively on the fixed table 6 and the two horizontal tables 5. and when the horizontal table 5 has been rotated by a predetermined angle which may be any angle, for example, 90 degrees, 180 degrees, 270 degrees, 360 degrees or other angles, the sections of the tracks on the rotated horizontal table 5 are adjacent to and align with the sections of the tracks on the fixed table 6 respectively.

The horizontal table 5 may be driven to rotate horizontally about its geometric center. A motor may be used to drive the horizontal table 5. As shown in FIG. 5, the horizontal table 5 may be rotated about the intersection of two diagonals of the rectangle, such that the loading frame 1 on the tracks 8 of the horizontal table 5 is rotated horizontally. The horizontal table 5 is spaced apart from the fixed table 6 to provide enough room for the rotation of the horizontal table 5. For instance, when the horizontal table 5 is rotated by 180 degrees, the sections of the tracks are aligned correspondingly. Thus, the loading frame 1 may be slid from the sections of the tracks on the horizontal table 5 to the sections of the tracks on the fixed table 6. The light source device 7 is placed on the fixed table 6 to perform exposure for the object to be exposed 2 fixed to the loading frame 1. The rotation of the horizontal table 5 may mechanically and horizontally move the loading frame 1. In this way, manpower is saved and operation continuity is improved.

Figure 7A:
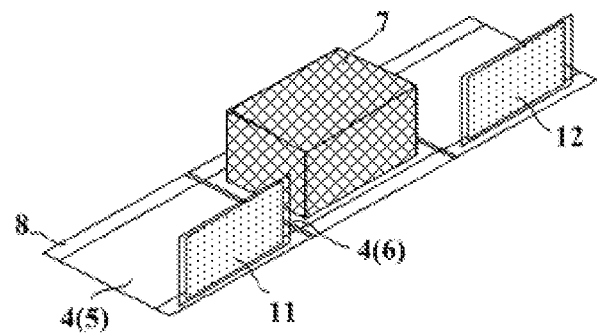
FIG. 7a to FIG. 7e show a process of a vertical bidirectional exposure operation of the exposure machine according to an exemplary embodiment of the present invention.
Figure 7B:
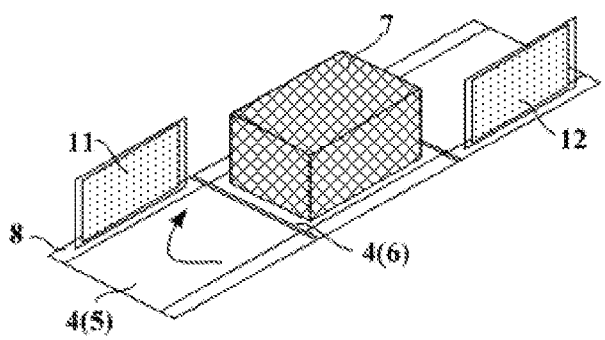

The tracks on the fixed table and one horizontal table at one side of the fixed table are both placed with the loading frames. For example, as shown in FIG. 5, the object to be exposed under exposure is placed at the exposure position where the object to be exposed faces the light source device; and for example, as shown in FIG. 7b, the object to be exposed that will be exposed next is placed at the non-exposure position where the object to be exposed next does not face the light source device; and then, after the exposure of the object to be exposed at the exposure position is completed, the loading frame with the exposed object is slid to another non-exposure position on the horizontal table at the other side of the fixed table. In this way, the continuity of the exposure operation is improved and thus the operation efficiency is improved.

Alternatively, in the case that the distance between the horizontal table and the fixed table is not large enough, the exposure machine further comprises a translation device configured to translate the horizontal table to move it to a position where the rotation of the horizontal table does not interfere with the fixed table and to return it back to a position adjacent to the fixed table.

Figure 6:
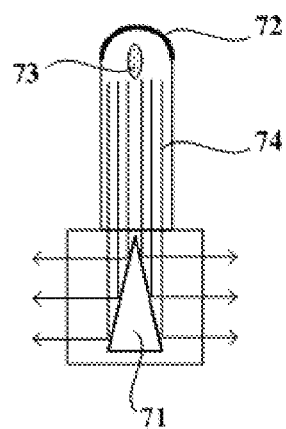
FIG. 6 is an illustrative view showing the inner structure of a light source device of the exposure machine according to an exemplary embodiment of the present invention.

Referring to FIG. 6, the inner structure of the light source device 7 of the exposure machine in FIG. 5 is shown. The light source device 7 includes: a light source 73 and a prism 71 located under the light source 73, wherein the light emitted vertically from the light source 73 is reflected in the horizontal direction from two sides of the prism 71 towards an exposure surface of the object to be exposed, and the reflected light is perpendicular to the exposure surface of the object to be exposed.

A portion of the light 74 emitted from the light source 73 is reflected back by a reflector 72, and a portion of the light is directly incident on the prism 71. The prism is used as a reflecting mirror to change a vertical optical path into a horizontal optical path. Adding a single prism 71 into the light source device in the prior art may achieve such a changing.

The implementation of the light source device is not limited to the above, and other optical structures may be used, as long as the light source device may provide light whose incidence direction is perpendicular to the exposure surface of the object to be exposed, and if a bidirectional exposure is desired, the light source device may be a pair of light source devices which emit light in opposite directions to provide a bidirectional exposure light source.

A specific exemplary implementation will be described next with reference to FIGS. 7a-7e to further explain the continuity operation of the bidirectional operation of the present invention.

Step 1: loading the object to be exposed to the loading frames 11 and 12. As shown in FIG. 7a, the loading frame 11 and the loading frame 12 are respectively placed vertically on the tracks 8 at the same side of the two horizontal tables 5, and the loading frames 11 and 12 are loaded with the objects to be exposed respectively.

Figure 7C:
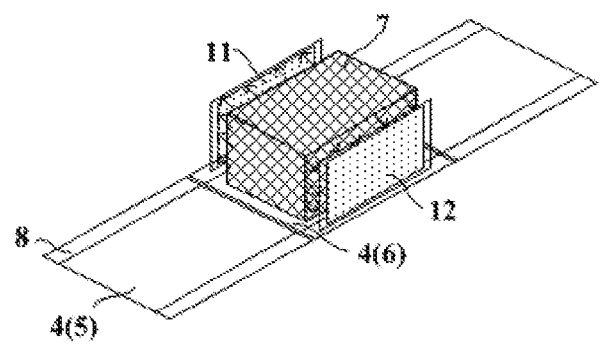

Step 2: rotating the loading frame 11 to change its position. As shown in FIG. 7b and FIG. 7c, the horizontal table 5 with the loading frame 11 is driven by a motor to rotate by 180 degrees about a geometric center thereof, so that the loading frame 11 and the loading frame 12 are located at two tracks 8 at opposite sides of the supporting table 4, respectively. The loading frame 11 and the loading frame 12 are slid along the tracks 8 (as shown in FIG. 7b), respectively to be at two sides of the light source device 7 (as shown in FIG. 7c).

Step 3: performing the bidirectional exposure. As shown in FIG. 7c, the light source device 7 produces two horizontal optical paths which are perpendicular to the loading frame 11 and the loading frame 12 respectively, to simultaneously expose the objects to be exposed on the loading frames 11 and 12.

Figure 7D:
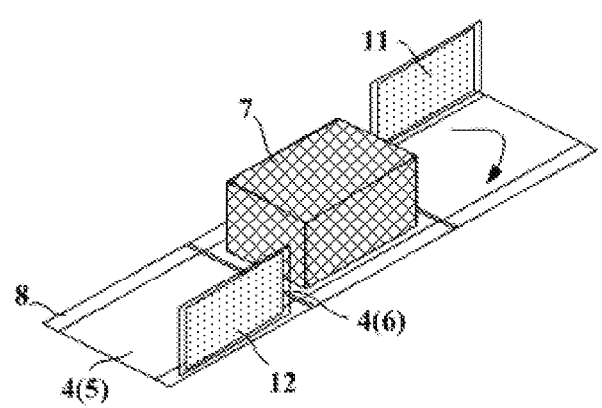

Step 4: changing the position of the loading frames after exposure. As shown in FIG. 7d, the loading frames 11 and 12 are slid in opposite directions along the tracks 8 to the horizontal tables 5.

Figure 7E:
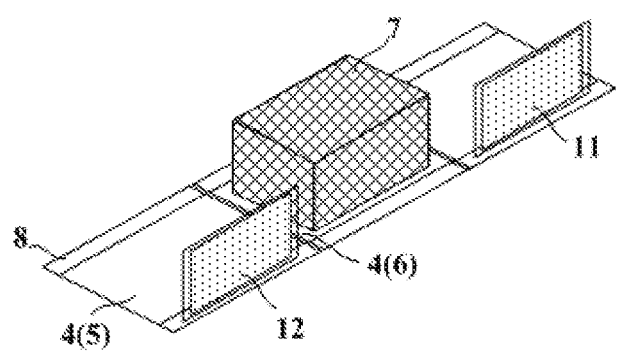

Step 5: unloading the exposed objects. As shown in FIG. 7e, the horizontal table 5 with the loading frame 11 is driven by the motor to rotate horizontally by 180 degrees about its geometric center to return to its unloading position for unloading the exposed object.

In the above embodiment of the present invention, the loading frame 11 is a frame structure. Therefore, when the light emitted from the light source device 7 is incident perpendicularly onto the object to be exposed 2, the stage spots are avoided because there is no reflection of the loading frame 11, which improves the exposure quality. In addition, since the contact area between the loading frame 11 and the object to be exposed 2 is small, the static electricity caused by friction is reduced too. Further, since the loading frame 11 is placed vertically, particle attachment is reduced. And Further, when the loading frames are placed vertically and the light emitted from the light source device 7 is divided into two horizontal optical paths, two objects to be exposed 2 may be exposed simultaneously, which improves the exposure efficiency greatly.

The above continuity operation of the bidirectional exposure is not limited to this. For example, two loading frames may be provided at first ends (at the same side) of the tracks, and then may be slid along the track to the exposure positions at two sides of the light source device 7, and then may be slid to second ends of the tracks opposite to the first ends after exposure. In short, the specific manner for the continuity operation may be designed or set according to production line arrangement, actual requirements and the like, and is not limited to this, as long as it may achieve continuity operation of bidirectional exposure.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An exposure machine, comprising:
a loading frame, for placing an object to be exposed;
a light source device, located at one side of a plane where the loading frame is positioned, wherein the light emitting direction of the light source device is perpendicular to a plane where the object to be exposed is positioned; and
a supporting table which is horizontally disposed, the light source device is placed on the supporting table, and the loading frame is provided vertically on the supporting table;
wherein the loading frame is of a hollow structure, such that after the object to be exposed is placed onto the frame, a surface of the object to be exposed is not in surface contact with the loading frame;
wherein the loading frame and the light source device are configured and arranged so that during exposing, the loading frame does not reflect the light transmitting through the object to be exposed, thus avoiding stage spots forming on the object to be exposed;
wherein the light source device comprises one light source and a prism located under the light source, wherein the light emitted vertically from the light source is reflected in the horizontal direction from two sides of the prism towards an exposure surface of the object to be exposed, and the reflected light is perpendicular to the exposure surface of the object to be exposed; and
wherein two loading frames are provided at two sides of the light source device respectively, and the light reflected in the horizontal direction from two sides of the prism is capable of exposing the objects to be exposed in the two loading frames at the same time.

2. The exposure machine of claim 1, wherein the loading frame is made of light-absorbing material.

3. The exposure machine of claim 1, wherein a frame edge of the loading frame is provided with a fixing member by means of which the object to be exposed is fixed to the loading frame.

4. The exposure machine of claim 3, wherein the fixing member is provided at a side of the loading frame which is opposed to an exposed surface of the object to be exposed.

5. The exposure machine of claim 4, wherein the fixing member is a vacuum chuck or clips.

6. The exposure machine of claim 5, wherein a portion of the vacuum chuck or clips which contacts with the object to be exposed is made of light-absorbing material.

7. The exposure machine of claim 1, wherein the supporting table is provided thereon with a track on which the loading frame is mounted in a slidable way, the loading frame being adapted to slide between an exposure position at which the loading frame faces the light source device and a non-exposure position at which the loading frame does not face the light source device.

8. The exposure machine of claim 7, wherein the track comprises two tracks which are parallel with each other and are disposed at two sides of the light source device respectively, and the loading frame includes two loading frames which are mounted to the two tracks in a slidable way respectively.

9. The exposure machine of claim 8, wherein the supporting table includes a fixed table and two horizontal tables disposed respectively at two sides of the fixed table, and the light source device is disposed on the fixed table, wherein each of the tracks is divided into three sections which are disposed respectively on the fixed table and the two horizontal tables, and when the horizontal table has been rotated by a predetermined angle, the sections of the tracks on the rotated horizontal table are adjacent to and align with the sections of the tracks on the fixed table respectively.

10. The exposure machine of claim 9, further comprising a translation device configured to translate the horizontal table to move it to a position where the rotation of the horizontal table does not interfere with the fixed table and to return it back to a position adjacent to the fixed table.

* * * * *